(12) United States Patent
Wang et al.

(10) Patent No.: US 9,373,712 B2
(45) Date of Patent: Jun. 21, 2016

(54) TRANSISTOR AND METHOD OF MANUFACTURING THE SAME

(71) Applicant: TAIWAN SEMICONDUCTOR MANUFACTURING CO., LTD., Hsinchu (TW)

(72) Inventors: Jhong-Sheng Wang, Taichung (TW); Jiaw-Ren Shih, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/500,626

(22) Filed: Sep. 29, 2014

(65) Prior Publication Data
US 2016/0093729 A1 Mar. 31, 2016

(51) Int. Cl.
*H01L 29/66* (2006.01)
*H01L 29/78* (2006.01)

(52) U.S. Cl.
CPC ...... *H01L 29/7816* (2013.01); *H01L 29/66681* (2013.01)

(58) Field of Classification Search
None
See application file for complete search history.

(56) References Cited

U.S. PATENT DOCUMENTS

| | | | |
|---|---|---|---|
| 7,608,513 B2 * | 10/2009 | Yang | H01L 29/7835 257/E21.427 |
| 2005/0017298 A1 * | 1/2005 | Xie et al. | 257/336 |
| 2006/0220120 A1 | 10/2006 | Horch | |
| 2010/0301403 A1 * | 12/2010 | Min | H01L 29/0619 257/316 |
| 2013/0009225 A1 * | 1/2013 | Kocon | H01L 27/0629 257/296 |
| 2013/0020632 A1 * | 1/2013 | Disney | 257/328 |
| 2013/0292763 A1 * | 11/2013 | Chang | H01L 29/7816 257/335 |
| 2015/0270389 A1 * | 9/2015 | Iravani | H01L 29/7816 257/339 |

OTHER PUBLICATIONS

Alan Wood et al., "High Performance Silicon LDMOS Technology for 2 GHz RF Power Amplifier Applications" Electron Devices Meeting, 1996. IEEE, IEDM, 96-87.
Koji Shirai et al., "Ultra-low On-Resistance LDMOS Implementation in 0.13μm CD and BiCD Process Technologies for Analog Power IC's" Power Semiconductor Devices & IC's, 2009.
Jian Hsing Lee et al., "The Influence of NBL Layout and LOCOS Space on Component ESD and System Level ESD for HV-LDMOS" Proceedings of the 19th International Symposium on Power Semiconductor Devices & Ics, May 27-30, 2007, Jeju, Korea.

* cited by examiner

*Primary Examiner* — Daniel Whalen
(74) *Attorney, Agent, or Firm* — Maschoff Brennan

(57) ABSTRACT

A transistor includes source region and drain regions, a channel region, a drift region, a gate, a dummy gate, a gate dielectric layer and an interconnection line. The source and drain regions of a first conductivity type are in a substrate. The channel region of a second conductivity type is in the substrate and surrounds the source region. The drift region of the first conductivity type is beneath the drain region and extends toward the channel region. The gate is over the substrate and overlapped with the channel region and the drift region. The dummy gate is over the drift region and laterally adjacent to the gate. The gate dielectric layer is between the gate and the substrate and between the dummy gate and the drift region. The interconnection line is electrically connected to the dummy gate and configured to provide a voltage potential thereto.

6 Claims, 8 Drawing Sheets

10

20

TRANSISTOR AND METHOD OF MANUFACTURING THE SAME

BACKGROUND

Power semiconductor devices including high-voltage integrated circuits (ICs) are currently being used in many applications. The high-voltage ICs that typically include high voltage metal-oxide-semiconductor (MOS) transistors are widely used in applications like automobile industry, display drivers, portable telecommunication devices and medical equipment.

A commonly used high-voltage MOS transistor for the high-voltage ICs is a laterally diffused MOS (LDMOS) transistor. The LDMOS transistor often possesses high breakdown voltage and thus can be utilized for these high-voltage applications. However, the higher the breakdown voltage of the LDMOS transistor typically scarifies the device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
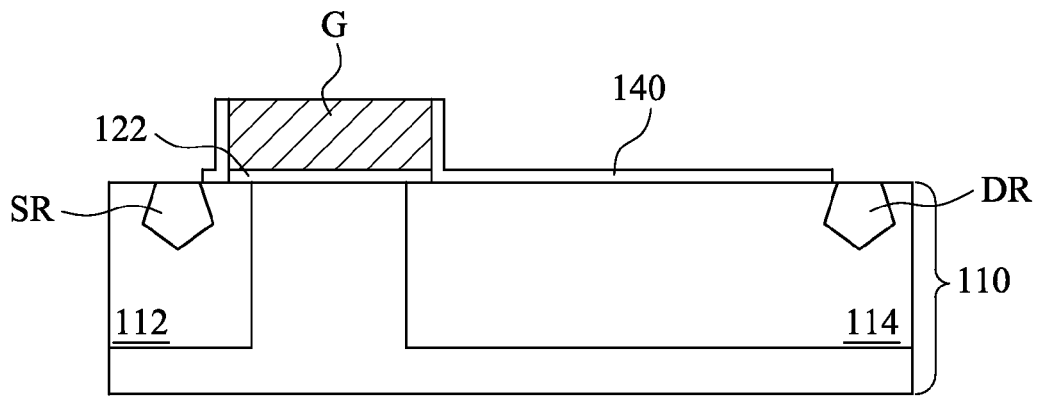
FIG. 1 is a cross-sectional view of a general transistor.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As mentioned above, the higher the breakdown voltage, the worse the device performance is. In contrast, the better the device performance, the worse the breakdown voltage is, which is related to device reliability. That is, the device performance and the device reliability are trade off.

FIGS. 1-4 are cross-sectional views of general transistors. As shown in FIG. 1, a transistor 10 includes a source region SR, a drain region DR, a channel region 112, a drift region 114, a gate G, a gate dielectric layer 122 and a protective layer 140. The channel region 112 and the drift region 114 are in a substrate 110. The source region SR and the drain region DR are respectively in the channel region 112 and the drift region 114. The gate G, the gate dielectric layer 122 and the protective layer 140 are over the substrate 10. The transistor 10 may provide high drain current but exhibit low time dependent dielectric breakdown (TDDB) and device breakdown since drain field may be directly penetrated to an edge of the gate G when the transistor 10 is at an off state, which results in poor device reliability.

Figure 2:
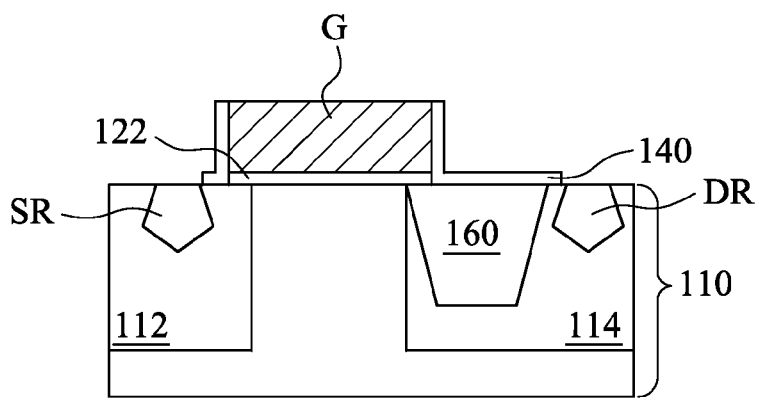
FIG. 2 is a cross-sectional view of a general transistor.

As shown in FIG. 2, a transistor 20 includes a source region SR, a drain region DR, a channel region 112, a drift region 114, a gate G, a gate dielectric layer 122, a protective layer 140 and an isolation region 160. The isolation region 160 may be a shallow-trench isolation (STI) region or a field oxide (FOX) region. The transistor 20 can provide good device reliability due to the presence of the isolation region 160, but exhibits very poor device performance due to long drain current path.

Figure 3:
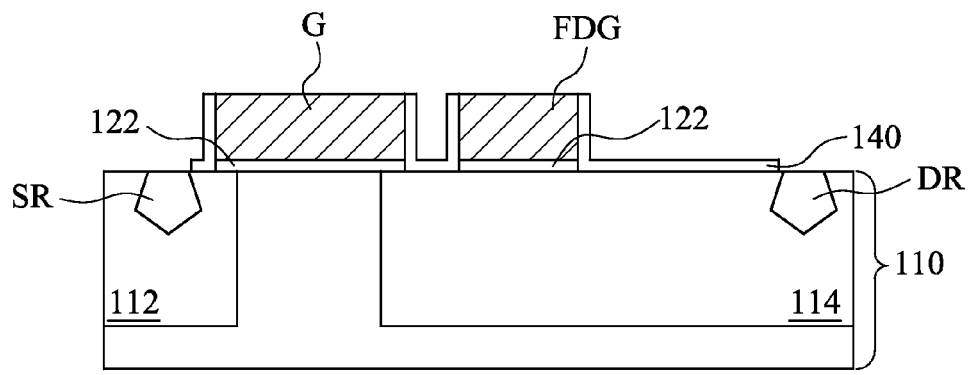
FIG. 3 is a cross-sectional view of a general transistor.

As shown in FIG. 3, a transistor 30 includes a source region SR, a drain region DR, a channel region 112, a drift region 114, a gate G, a floating dummy gate FDG, a gate dielectric layer 122 and a protective layer 140. The floating dummy gate FDG is designed to prevent current passing near a surface of the drift region 114 and to increase resistance of the drift region 214 when the transistor 30 is at on state. However, when the transistor 30 is at off state, drain field may be directly penetrated to an edge of the gate G. In order to meet requirements of device reliability, a length of the drift region 114 or the gate G should be increased, which is unfavorable to device size and device performance.

Figure 4:
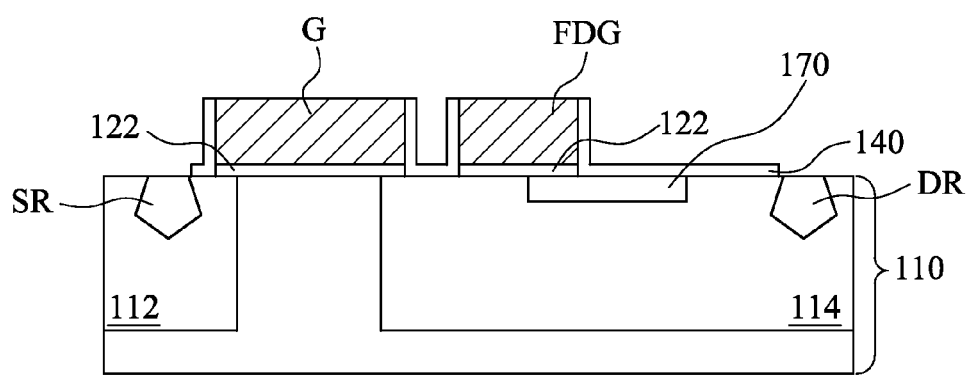
FIG. 4 is a cross-sectional view of a general transistor.

As shown in FIG. 4, a transistor 40 includes a source region SR, a drain region DR, a channel region 112, a drift region 114, a gate G, a floating dummy gate FDG, a gate dielectric layer 122, a protective layer 140 and a counter implant region 170. The difference between the transistors 30, 40 of FIGS. 3-4 is that the transistor 40 further includes the counter implant region 170 designed to suppress drain field and thus to improve device reliability when the transistor 40 is at off state. However, device performance is poor when the transistor 40 is at on state due to long drain current path. In addition, there is a need for an additional mask for forming the counter implant region 170, which requires extra cost.

In view of the foregoing, the present application provides a transistor including a source region, a drain region, a channel region, a drift region, a gate, a dummy gate, a gate dielectric layer and an interconnection line. The interconnection line is electrically connected to the dummy gate and configured to provide a voltage potential to the dummy gate. The dummy gate receiving the voltage potential is configured to let drain current pass near a surface of the drift region, and thus to significantly increase drain current and improve device performance when the transistor is at on state. Embodiments of the transistor and a method for manufacturing the transistor will be sequentially described below in detail.

Figure 5:
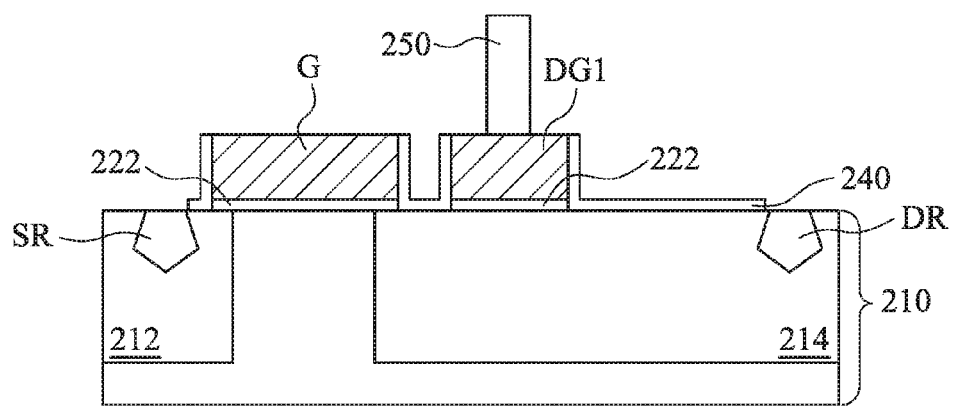
FIG. 5 is a cross-sectional view of a transistor in accordance with some embodiments of the present disclosure.

FIG. 5 is a cross-sectional view of a transistor in accordance with some embodiments of the present disclosure. The transistor 50 includes a source region SR, a drain region DR, a channel region 212, a drift region 214, a gate G, a dummy gate DG1, a gate dielectric layer 222 and an interconnection line 250.

The source region SR and the drain region DR are of a first conductivity type and in a substrate 210. In some embodiments, the substrate 210 includes an elementary semiconductor including silicon or germanium in crystal, polycrystalline, or an amorphous structure; a compound semiconductor including silicon carbide, gallium arsenide, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the substrate 210 is an n-type or p-type semiconductor substrate. In some embodiments, the transistor 50 is an n-type transistor, and the substrate 210 is a p-type semiconductor substrate. In some embodiments, the transistor 50 is a p-type transistor, and the substrate 210 is an n-type semiconductor substrate. In some embodiments, each of the source region SR and the drain region DR has a dopant concentration ranging from about $10^{18}$ ions/cm$^3$ to about $10^{20}$ ions/cm$^3$.

The channel region 212 of a second conductivity type opposite to the first conductivity type is in the substrate 210 and surrounds the source region SR. In some embodiments, the transistor 50 is an n-type transistor, and the channel region 212 includes p-type dopants, such as boron, boron difluoride, or another suitable p-type dopants or a combination thereof. In some embodiments, the transistor 50 is a p-type transistor, and the channel region 212 includes n-type dopants, such as phosphorus, arsenic, antimony, bismuth, selenium, tellurium, another suitable n-type dopants or a combination thereof.

The drift region 214 of the first conductivity type is beneath the drain region DR and extends toward the channel region 212. In the embodiments shown in FIG. 5, the drift region 214 is separated from the channel region 212. In other embodiments, the drift region is laterally adjacent to and in contact with the channel region. In some embodiments, the transistor 50 is an n-type transistor, and the drift region 214 includes n-type dopants, such as phosphorus, arsenic, antimony, bismuth, selenium, tellurium, another suitable n-type dopants or a combination thereof. In some embodiments, the transistor 50 is a p-type transistor, and the drift region 214 includes p-type dopants, such as boron, boron difluoride, or another suitable p-type dopants or a combination thereof.

The gate G is over the substrate 210 and overlapped with a portion of the channel region 212 and a portion of the drift region 214. In some embodiments, the gate G is a single layer structure or a multi layer structure. In some embodiments, the gate G includes metal, alloy, ceramet, ceramal or a combination thereof. The term "ceramet" refers to a composite material composed of ceramic and metallic materials. The term "ceramal" refers to a composite material composed of ceramic and alloy materials. In some embodiments, the gate G includes titanium (Ti), tantalum (Ta), tungsten (W), aluminum (Al), zirconium (Zr), hafnium (Hf) or a combination thereof. In some embodiments, the gate G includes polysilicon or another suitable materials. The material of the gate G may be selected in accordance with the conductive type (i.e., n-type or p-type) of the transistor 50.

The gate G has a work function. The term "work function" refers to the minimum energy (usually expressed in electron volts) needed to remove an electron from a neutral solid to a point immediately outside the solid surface (or energy needed to move an electron from the Fermi energy level into vacuum). Here "immediately" means that the final electron position is far from the surface on the atomic scale but still close to the solid surface on the macroscopic scale.

The dummy gate DG1 is over the drift region 214 and laterally adjacent to the gate G. In some embodiments, the dummy gate DG1 is a single layer structure or a multi layer structure. In some embodiments, the dummy gate DG1 includes metal, alloy, ceramet, ceramal or a combination thereof. In some embodiments, the dummy gate DG1 includes titanium (Ti), tantalum (Ta), tungsten (W), aluminum (Al), zirconium (Zr), hafnium (Hf) or a combination thereof. The material of the dummy gate DG1 may be selected in accordance with the conductive type of the transistor 50.

In some embodiments, the dummy gate DG1 includes metal, such as titanium (Ti), tantalum (Ta), tungsten (W), aluminum (Al), zirconium (Zr), hafnium (Hf) or other suitable metals. In some embodiments, the dummy gate DG1 includes alloy, such as titanium aluminum (TiAl), tantalum aluminum (TaAl), tungsten aluminum (WAl), zirconium aluminum (ZrAl), hafnium aluminum (HfAl), a combination thereof or other suitable alloys. In some embodiments, the dummy gate DG1 includes ceramet, such as titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), a combination thereof or other suitable ceramets. In some embodiments, the dummy gate DG1 includes ceramal, such as titanium aluminum carbide (TiAlC), tantalum aluminum carbide (TaAlC), titanium aluminum nitride (TiAlN), tantalum aluminum nitride (TaAlN), a combination thereof or other suitable ceramals. The element ratio of the alloy, ceramet or ceramal can be adjusted, and is not limited to those exemplified above.

The dummy gate DG1 has a work function. The work function of the gate G may be the same as or different from the work function of the dummy gate DG1. In practical applications, the work function and the distribution location of the dummy gate DG1 may be designed to meet the requirements of device performance and device reliability.

The gate dielectric layer 222 is between the gate G and the substrate 210 and between the dummy gate DG1 and the drift region 214. In some embodiments, the gate dielectric layer 222 includes a dielectric material such as silicon oxide, silicon nitride, silicon oxynitride or another suitable insulating material.

The interconnection line 250 is electrically connected to the dummy gate DG1 and configured to provide a voltage potential to the dummy gate DG1. The dummy gate DG1 receiving the voltage potential is configured to let drain current pass near a surface of the drift region 214, and thus to significantly increase drain current and improve device performance when the transistor 50 is at on state. Moreover, the interconnection line 250 and other interconnection lines (not shown), such as interconnection lines respectively electrically connected to the source region SR and the drain region DR, may be simultaneously formed, and thus there is no need for extra process to form the interconnection line 250.

In some embodiments, the interconnection line 250 includes metal, alloy, ceramet, ceramal or a combination thereof, such as titanium (Ti), tantalum (Ta), tungsten (W), aluminum (Al), copper (Cu), molybdenum (Mo), platinum (Pt), titanium aluminum (TiAl), titanium nitride (TiN), tantalum nitride (TaN), titanium silicon nitride (TiSiN), titanium carbide (TiC), tantalum carbide (TaC), tantalum carbonitride (TaCN), molybdenum nitride (MoN), molybdenum oxynitride (MoON), ruthenium oxide (RuO2), titanium aluminum nitride (TiAlN), a combination thereof or other suitable materials. In some embodiments, the gate G is electrically connected to the dummy gate DG1 by forming an inter-layer dielectric (ILD) (not marked) over the gate G and the dummy gate DG1, forming openings (not marked) in the ILD layer, and forming a conductive material in the openings to form an interconnection line 252, as shown in FIG. 7, and thus both the gate G and the dummy gate DG1 may receive a power supply voltage (Vcc).

In some embodiments, the transistor 50 further includes a protective layer (or called as spacer) 240. In some embodiments, the protective layer 240 is made of silicon oxide, silicon nitride, silicon oxynitride or another suitable materials.

Figure 6:
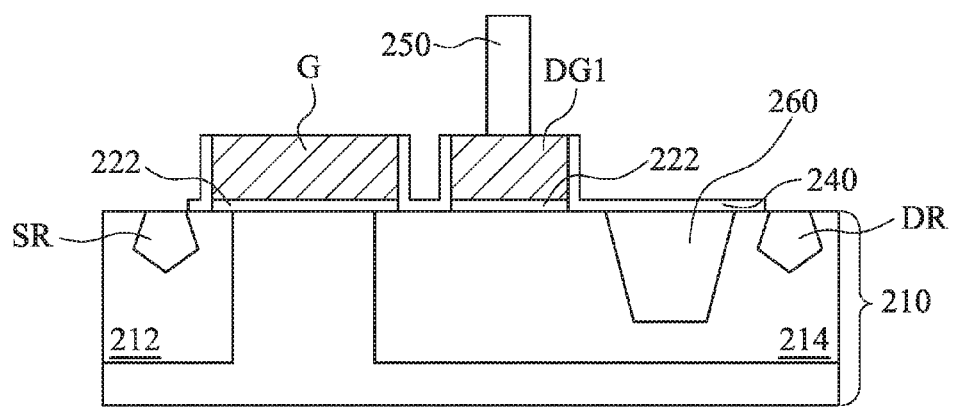
FIG. 6 is a cross-sectional view of a transistor in accordance with some embodiments of the present disclosure.

FIG. 6 is a cross-sectional view of a transistor in accordance with some embodiments of the present disclosure. The difference between the embodiments of FIGS. 5 and 6 is that in FIG. 6, the transistor 60 further includes an isolation region 260 in the drift region 214 and adjacent to the drain region DR. In some embodiments, the isolation region 260 is not overlapped with the dummy gate DG1. The isolation region 260 may be a shallow-trench isolation (STI) region or a field oxide (FOX) region. The transistor 60 can exhibit good device reliability due to the presence of the isolation region 160 and good device performance due to the presence of the dummy gate DG1 having the voltage potential when the transistor 60 is at on state.

Figure 7:
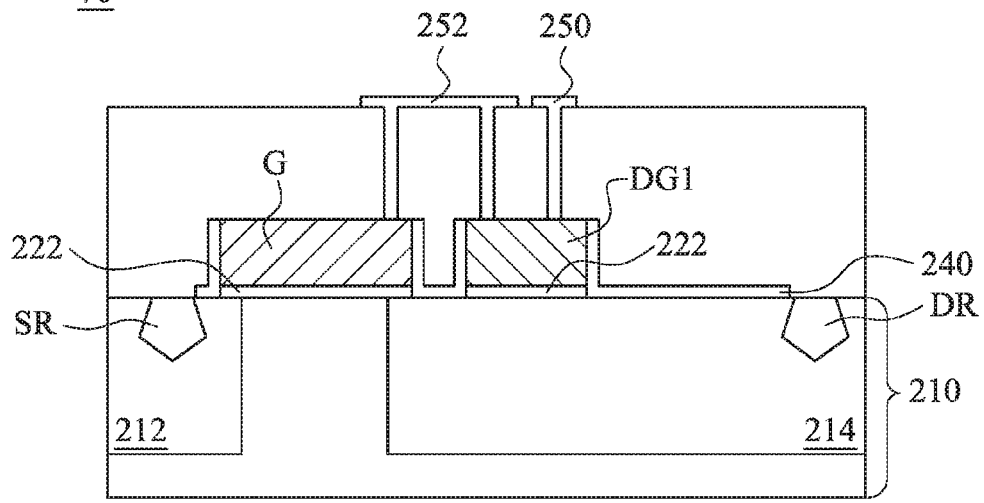
FIG. 7 is a cross-sectional view of a transistor in accordance with some embodiments of the present disclosure.

FIG. 7 is a cross-sectional view of a transistor in accordance with some embodiments of the present disclosure. The difference between the embodiments of FIGS. 5 and 7 is that in FIG. 7, the gate G has a work function different from a work function of the dummy gate DG1. In some embodiments, the gate G and the dummy gate DG1 include metal, alloy, ceramet, ceramal or a combination thereof. The work function of the gate G and that of the dummy gate DG1 may be determined by composition and element ratio. In some embodiments, the work function of the gate G is smaller than the work function of the dummy gate DG1 when the transistor 70 is an n-channel transistor, and thus lateral drain field can be blocked through the dummy gate DG1 when the transistor 70 is at off state. In some embodiments, the work function of the gate G is greater than the work function of the dummy gate DG1 when the transistor 70 is a p-channel transistor, and thus lateral drain field can be blocked through the dummy gate DG1 when the transistor 70 is at off state. Accordingly, the transistor 70 possesses good device performance and good device reliability simultaneously. In addition, in the case of the same device reliability, the transistor 50 may have a smaller device size compared to the transistor 30.

Figure 8:
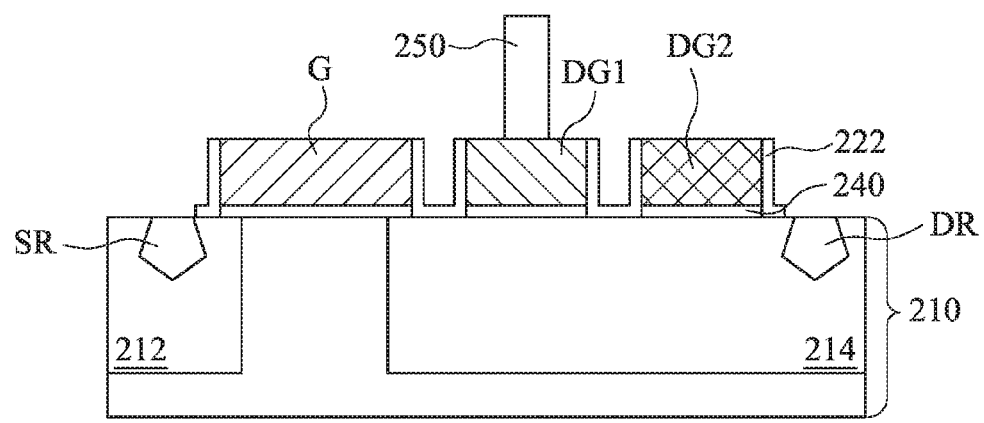
FIG. 8 is a cross-sectional view of a transistor in accordance with some embodiments of the present disclosure.

FIG. 8 is a cross-sectional view of a transistor in accordance with some embodiments of the present disclosure. The difference between the embodiments of FIGS. 7 and 8 is that in FIG. 8, the transistor 80 further includes another dummy gate DG2 over the drift region 214 and laterally adjacent to the dummy gate DG1. The dummy gate DG2 is configured to help the dummy gate DG1 to alter drain current and block drain field. In some embodiments, the dummy gate DG2 is a floating dummy gate. In some embodiments, the dummy gate DG2 is electrically connected to the dummy gate DG1. In some embodiments, the dummy gate DG2 has a work function the same as or different from that of the dummy gate DG1. In practical applications, the distribution location in a top view, the voltage potential when the transistor 80 is at on state and the work function of the dummy gates DG1, DG2 are tunable to meet requirements of device performance and device reliability, and thus not limited to the embodiments exemplified in the specification. In addition, the transistor may include three or more dummy gates.

Figure 9:
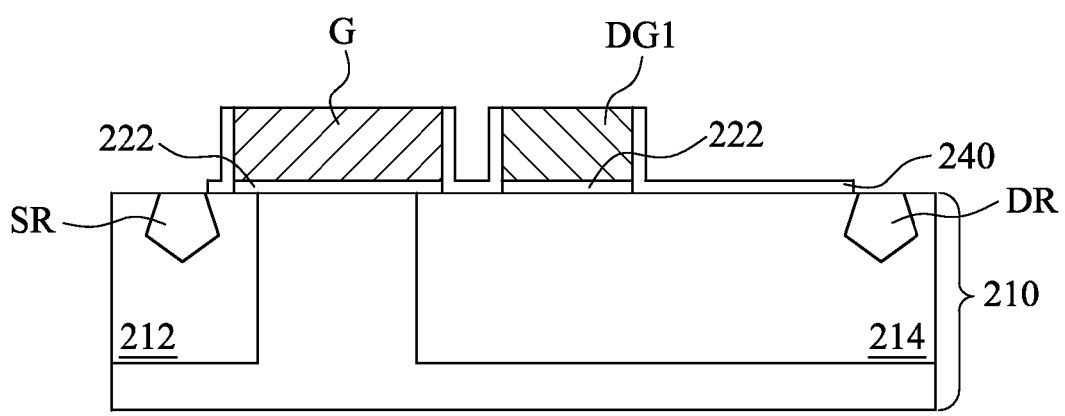
FIG. 9 is a cross-sectional view of a transistor in accordance with some embodiments of the present disclosure.

FIG. 9 is a cross-sectional view of a transistor in accordance with some embodiments of the present disclosure. The transistor 90 includes a source region SR, a drain region DR, a channel region 212, a drift region 214, a gate G, a dummy gate DG1 and a gate dielectric layer 222. The gate G has a work function different from a work function of the dummy gate DG1, and thus to block lateral drain field by the dummy gate DG1 when the transistor 90 is at off state, which results in high breakdown voltage and good device reliability. In some embodiments, the work function of the gate G is smaller than the work function of the dummy gate DG1 when the transistor 90 is an re-channel transistor. In some embodiments, the work function of the gate G is greater than the work function of the dummy gate DG1 when the transistor 90 is a p-channel transistor.

As mentioned above, each of the transistors 50, 60, 70, 80 can exhibit good device performance because of the dummy gate DG1 having a voltage potential at on state. In another aspect, each of the transistors 70, 80, 90 can exhibit good device reliability because the work function of the gate G is different from that of the dummy gate DG1. It is noteworthy that the device reliability of the transistors 70, 80, 90 can be altered by changing the material of the dummy gate DG1, and thus it is not unfavorable to device size.

FIGS. 10A-10F are cross-sectional views at various stages of manufacturing a transistor in accordance with some embodiments of the present disclosure.

Figure 10A:
FIGS. 10A-10F are cross-sectional views at various stages of manufacturing a transistor in accordance with some embodiments of the present disclosure.

As shown in FIG. 10A, a substrate 210 having a drift region 214 and a channel region 212 is received. The drift region 214 and the channel region 212 are in the substrate 210, and the channel region 212 is adjacent to the drift region 214. The drift region 214 is of a first conductivity type, and the channel region 212 is of a second conductivity type opposite to the first conductivity type. The drift region 214 is acted as an extension of a drain region to be formed subsequently. In some embodiments, the drift region 214 is formed by implantation of the first conductive type dopants, and the channel region 212 is formed by implantation of the second conductive type dopants. The formation of the channel region 212 may be prior or next to the formation of the drift region 214.

Figure 10B:
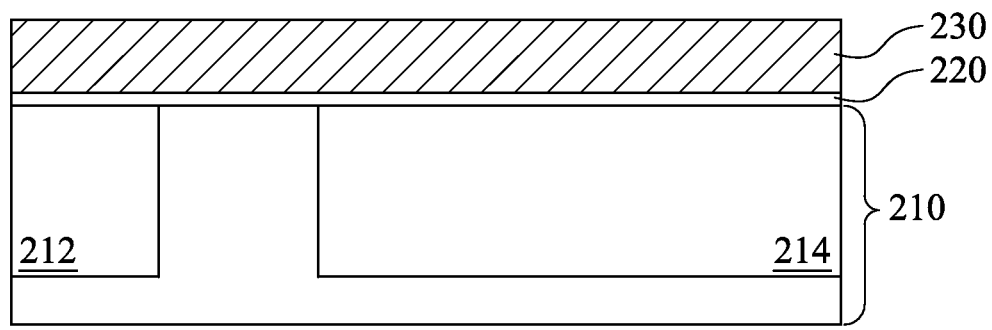

As shown in FIG. 10B, a dielectric layer 220 and a gate layer 230 are sequentially formed over the substrate 210. In some embodiments, a dielectric material and a gate material are sequentially blanket deposited on the substrate 210 to form the dielectric layer 220 and the gate layer 230. In some embodiments, the dielectric material is blanket deposited using a PVD process, a CVD process, a spin-on coating process, a thermal dry oxidation, a thermal wet oxidation or another formation process. In some embodiments, the gate material is blanket deposited using a PVD process, a CVD process, an ALD process, a plating process, a spin-on coating process or another suitable formation process.

Figure 10C:
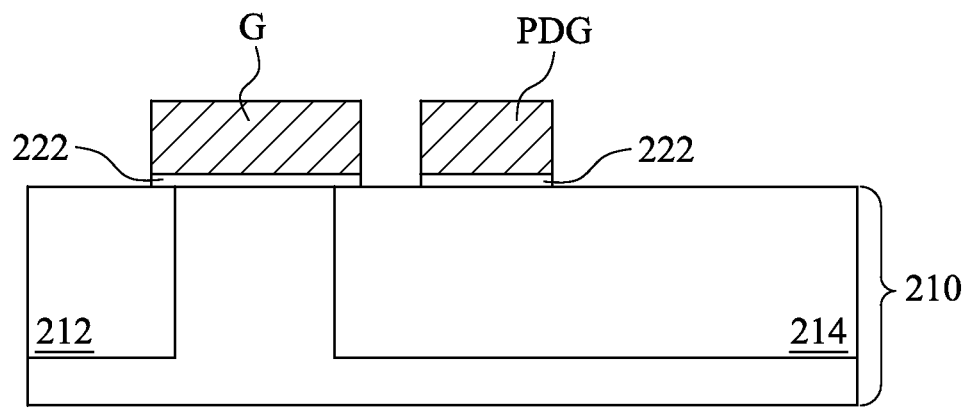

As shown in FIGS. 10B-10C, the gate layer 230 and the dielectric layer 220 beneath the gate layer 230 are patterned to form the gate G, the pre-dummy gate PDG and the gate dielectric layer 222 over the substrate 210. The gate G is overlapped with a portion of the channel region 212 and a portion of the drift region 214. The pre-dummy gate PDG is over the drift region 214 and laterally adjacent to the gate G. The gate dielectric layer 222 is between the gate G and the substrate 210 and between the pre-dummy gate PDG and the drift region 214. In some embodiments, the gate layer 230 and the dielectric layer 220 are patterned using a photolithography/etching process or another suitable material removal process.

Figure 10D:
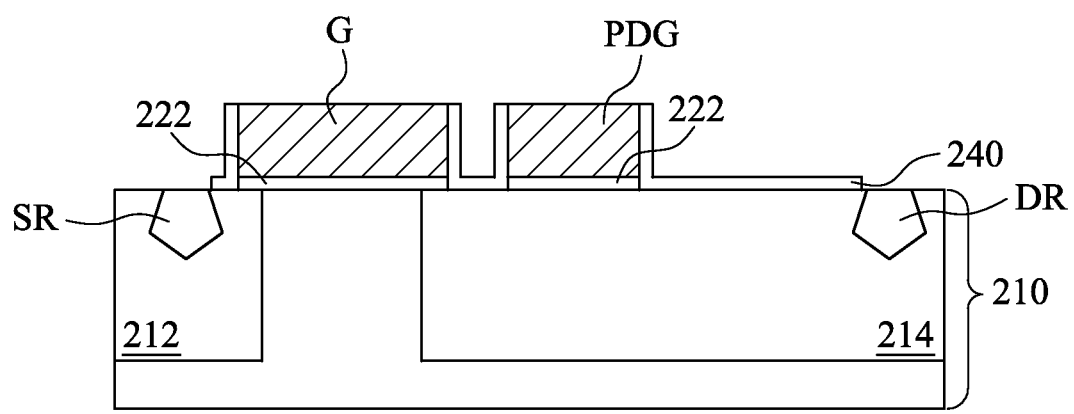

As shown in FIG. 10D, a protective layer (or called as spacer) 240 is formed covering sidewalls of the gate G and sidewalls of the pre-dummy gate PDG. In some embodiments, a protective material is blanket deposited covering the gate G, the pre-dummy gate PDG, the gate dielectric layer 222, the channel region 212 and the drift region 214, and a trimming process, such as an anisotropic dry etch process, is then performed on the protective material to form the protective layer 240. In some embodiments, the protective material is made of silicon oxide, silicon nitride, silicon oxynitride or another suitable materials.

After the protective layer 240 is formed, a source region SR and a drain region DR are respectively formed in the channel region 212 and the drain region 214, as shown in FIG. 10D. The source region SR and the drain region DR are of the first conductivity type. In some embodiments, the first type dopants are implanted into a selective area of the channel region 212 and a selective area of the drift region 214 to form the source region SR and the drain region DR.

Figure 10E:
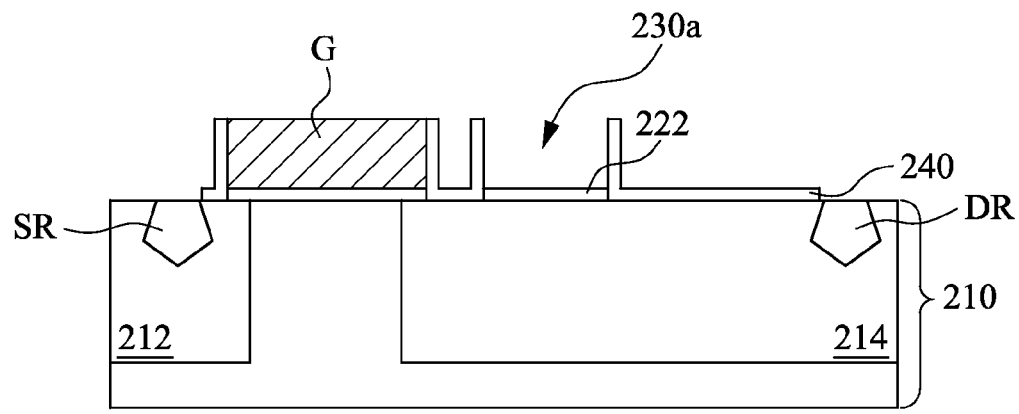

As shown in FIG. 10E, the pre-dummy gate PDG is removed to form a cavity 230a confined by the protective layer 240. In some embodiments, the pre-dummy gate PDG is removed using a wet etching process, and the protective layer 240 is not removed due to selectivity of the etchant.

Figure 10F:
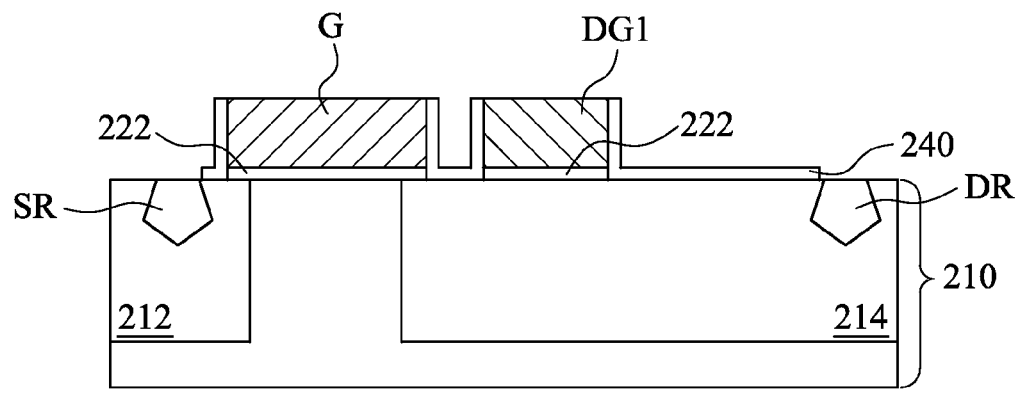

As shown in FIG. 10F, a dummy gate DG1 is formed in the cavity 230a. In some embodiments, the dummy gate DG1 is formed by deposition, such as CVD process, a PVD process, an ALD process, a spin-on coating process or another formation process. In some embodiments, the metal-containing material includes metal, alloy, ceramet, ceramal or a combination thereof.

In some embodiments, the method further includes forming an interconnection line 250 electrically connected to the dummy gate DG1, as shown in FIG. 7. In some embodiments, before the interconnection line 250 is formed, an inter-layer dielectric (ILD) (not shown) is formed covering the source region SR, the drain region DR, the channel region 212, the drift region 214, the gate G and the dummy gate DG1. The ILD may be formed using a CVD process, a PVD process, an ALD process, a spin-on process or another suitable formation process. The ILD is then patterned to form an opening (not shown), and a conductive material is then filled in the opening to form the interconnection line 250. In some embodiments, the ILD is patterned using a photolithography/etching process, a laser drilling process or another suitable material removal process. In some embodiments, the conductive material is formed using a CVD process, a PVD process, an ALD process, a spin-on coating process or another formation process.

According to some embodiments, a transistor includes a source region, a channel region, a drift region, a gate, a dummy gate, a gate dielectric layer and an interconnection line. The source region of a first conductivity type and the drain region of the first conductivity type are in a substrate. The channel region of a second conductivity type opposite to the first conductivity type is in the substrate and surrounds the source region. The drift region of the first conductivity type is beneath the drain region and extends toward the channel region. The gate is over the substrate and overlapped with a portion of the channel region and a portion of the drift region. The dummy gate is over the drift region and laterally adjacent to the gate. The gate dielectric layer is between the gate and the substrate and between the dummy gate and the drift region. The interconnection line is electrically connected to the dummy gate and configured to provide a voltage potential to the dummy gate.

According to some embodiments, a transistor includes a source region, a channel region, a drift region, a gate, a dummy gate and a gate dielectric layer. The source region of a first conductivity type and the drain region of the first conductivity type are in a substrate. The channel region of a second conductivity type opposite to the first conductivity type is in the substrate and surrounds the source region. The drift region of the first conductivity type is beneath the drain region and extends toward the channel region. The gate is over the substrate and overlapped with a portion of the channel region and a portion of the drift region. The dummy gate is over the drift region and laterally adjacent to the gate, in which the gate has a work function different from a work function of the dummy gate. The gate dielectric layer is between the gate and the substrate and between the dummy gate and the drift region.

According to some embodiments, a substrate having a drift region in the substrate and a channel region in the substrate and adjacent to the drift region is received. The drift region is of a first conductivity type, and the channel region is of a second conductivity type opposite to the first conductivity type. A gate, a pre-dummy gate and a gate dielectric layer are formed over the substrate. The gate is overlapped with a portion of the channel region and a portion of the drift region. The pre-dummy gate is over the drift region and laterally adjacent to the gate. The gate dielectric layer is between the gate and the substrate and between the pre-dummy gate and the drift region. A protective layer is formed covering sidewalls of the gate and sidewalls of the pre-dummy gate. A source region and a drain region are respectively formed in the channel region and the drift region. The source region and the drain region are of the first conductivity type. The pre-dummy gate is removed to form a cavity. A dummy gate is formed in the cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A transistor, comprising:
  a source region of a first conductivity type and a drain region of the first conductivity type in a substrate;
  a channel region of a second conductivity type opposite to the first conductivity type in the substrate and surrounding the source region;
  a drift region of the first conductivity type beneath the drain region and extending toward the channel region;
  a gate over the substrate and overlapped with a portion of the channel region and a portion of the drift region;
  a metal-containing material over the drift region and laterally adjacent to the gate, wherein the gate has a work function different from a work function of the metal-containing material and the gate is electrically connected to the metal-containing material; and a gate dielectric layer between the gate and the substrate and between the metal-containinq material and the drift region.

2. The transistor of claim 1, wherein the work function of the gate is smaller than the work function of the metal-containing material when the transistor is an n-channel transistor.

3. The transistor of claim 1, wherein the work function of the gate is greater than the work function of the metal-containing material when the transistor is a p-channel transistor.

4. The transistor of claim 1, wherein the metal-containinq material comprises titanium aluminum (TiAl), tantalum aluminum (TaAl), tungsten aluminum (WAl), zirconium aluminum (ZrAl), hafnium aluminum (HfAl), or a combination thereof.

5. The transistor of claim 1, wherein the metal-containinq material comprises titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), or a combination thereof.

6. The transistor of claim 1, wherein the metal-containinq material comprises titanium aluminum carbide (TiAlC), tantalum aluminum carbide (TaAlC), titanium aluminum nitride (TiAlN), tantalum aluminum nitride (TaAlN), or a combination thereof.

* * * * *